United States Patent
Chang et al.

(10) Patent No.: US 8,980,707 B2
(45) Date of Patent: Mar. 17, 2015

(54) FLOATING BODY MEMORY CELL HAVING GATES FAVORING DIFFERENT CONDUCTIVITY TYPE REGIONS

(71) Applicants: Peter L. D. Chang, Portland, OR (US); Uygar E. Avci, Portland, OR (US); David Kencke, Beaverton, OR (US); Ibrahim Ban, Beaverton, OR (US)

(72) Inventors: Peter L. D. Chang, Portland, OR (US); Uygar E. Avci, Portland, OR (US); David Kencke, Beaverton, OR (US); Ibrahim Ban, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 14/028,043

(22) Filed: Sep. 16, 2013

(65) Prior Publication Data
US 2014/0015021 A1 Jan. 16, 2014

Related U.S. Application Data

(62) Division of application No. 13/534,985, filed on Jun. 27, 2012, now Pat. No. 8,569,812, which is a division of application No. 11/644,715, filed on Dec. 22, 2006, now Pat. No. 8,217,435.

(51) Int. Cl.
| | |
|---|---|
| *H01L 21/8238* | (2006.01) |
| *H01L 29/78* | (2006.01) |
| *H01L 27/108* | (2006.01) |
| *H01L 27/12* | (2006.01) |
| *H01L 29/66* | (2006.01) |

(Continued)

(52) U.S. Cl.
CPC .............. *H01L 29/78* (2013.01); *H01L 27/108* (2013.01); *H01L 27/10802* (2013.01); *H01L 27/1203* (2013.01); *H01L 29/7841* (2013.01); *H01L 29/66477* (2013.01); *H01L 27/10826* (2013.01); *H01L 27/10879* (2013.01); *H01L 29/785* (2013.01); *Y10S 257/903* (2013.01)
USPC ............ 438/212; 438/197; 438/283; 257/903

(58) Field of Classification Search
USPC .................................. 438/157, 197, 212, 283
See application file for complete search history.

(56) References Cited

U.S. PATENT DOCUMENTS

| | | |
|---|---|---|
| 5,668,035 A | 9/1997 | Fang et al. |
| 5,998,828 A | 12/1999 | Ueno et al. |

(Continued)

FOREIGN PATENT DOCUMENTS

| | | |
|---|---|---|
| JP | 08-316337 | 11/1996 |
| JP | 2002-329795 | 11/2002 |

(Continued)

OTHER PUBLICATIONS

Office Action from German Patent Application No. 10 2007 060 694.1-33 mailed Apr. 22, 2009, 7 pgs..

(Continued)

*Primary Examiner* — Calvin Choi
(74) *Attorney, Agent, or Firm* — Blakely, Sokoloff, Taylor & Zafman LLP

(57) ABSTRACT

A method for fabricating floating body memory cells (FBCs), and the resultant FBCs where gates favoring different conductivity type regions are used is described. In one embodiment, a p type back gate with a thicker insulation is used with a thinner insulated n type front gate. Processing, which compensates for misalignment, which allows the different oxide and gate materials to be fabricated is described.

17 Claims, 19 Drawing Sheets

(51) Int. Cl.
*H01L 21/336* (2006.01)
*H01L 21/8234* (2006.01)

(56) References Cited

U.S. PATENT DOCUMENTS

| | | | |
|---|---|---|---|
| 6,037,222 | A | 3/2000 | Huang et al. |
| 6,396,108 | B1 | 5/2002 | Krivokapic et al. |
| 6,433,382 | B1 | 8/2002 | Orlowski et al. |
| 6,492,212 | B1 | 12/2002 | Ieong et al. |
| 6,617,651 | B2 | 9/2003 | Ohsawa |
| 6,632,723 | B2 | 10/2003 | Watanabe et al. |
| 6,778,424 | B2 | 8/2004 | Iwata et al. |
| 6,964,903 | B2 | 11/2005 | Forbes et al. |
| 7,056,773 | B2 | 6/2006 | Bryant et al. |
| 7,329,913 | B2 | 2/2008 | Brask et al. |
| 7,335,934 | B2 | 2/2008 | Fazan |
| 7,498,211 | B2 | 3/2009 | Ban et al. |
| 7,781,810 | B1 * | 8/2010 | An et al. ............. 257/288 |
| 2002/0096724 | A1 | 7/2002 | Liang et al. |
| 2002/0180069 | A1 | 12/2002 | Houston |
| 2004/0075122 | A1 | 4/2004 | Lin et al. |
| 2004/0100306 | A1 | 5/2004 | Krivokapic et al. |
| 2004/0251487 | A1 | 12/2004 | Wu et al. |
| 2004/0262679 | A1 | 12/2004 | Ohsawa |
| 2005/0062088 | A1 | 3/2005 | Houston |
| 2005/0087811 | A1 | 4/2005 | Liao et al. |
| 2005/0199920 | A1 * | 9/2005 | Lee et al. ............. 257/288 |
| 2005/0245009 | A1 | 11/2005 | Bryant et al. |
| 2006/0014331 | A1 | 1/2006 | Tang et al. |
| 2006/0081851 | A1 | 4/2006 | Ono |
| 2006/0125011 | A1 | 6/2006 | Chang |
| 2006/0289953 | A1 | 12/2006 | Sakuma et al. |
| 2007/0069302 | A1 | 3/2007 | Jin et al. |
| 2007/0111448 | A1 * | 5/2007 | Li et al. ............. 438/264 |
| 2007/0170509 | A1 * | 7/2007 | Izumida ............. 257/353 |
| 2007/0231997 | A1 * | 10/2007 | Doyle et al. ............. 438/253 |
| 2007/0252175 | A1 | 11/2007 | Tang et al. |
| 2007/0278578 | A1 | 12/2007 | Yoshida et al. |
| 2008/0006908 | A1 | 1/2008 | Lin et al. |
| 2008/0157162 | A1 | 7/2008 | Doyle et al. |

FOREIGN PATENT DOCUMENTS

| | | |
|---|---|---|
| JP | 2003-031693 | 1/2003 |
| JP | 2005-026366 | 1/2005 |
| JP | 2008-124209 | 5/2008 |
| KR | 1020060068038 | 6/2006 |
| WO | WO2006087798 | 8/2006 |

OTHER PUBLICATIONS

First Office Action from Chinese Patent Application No. 200710305369.3 mailed Jun. 19, 2009, 11 pgs..
Notice of Preliminary Rejection from Korean Patent Application No. 10-2007-135823 mailed Sep. 28, 2009, 3 pgs..
Office Action (Search Report and Written Opinion) from Dutch Patent Application No. 2001100 mailed Jan. 20, 2010, 10 pgs..
Second Office Action from Chinese Patent Application No. 200710305369.3 mailed Oct. 12, 2010, 8 pgs..
Notice of Preliminary Rejection from Korean Patent Application No. 10-2007-135823 mailed Apr. 30, 2010, 5 pgs..
Notice of Final Rejection from Korean Patent Application No. 10-2007-135823 mailed Nov. 30, 2010, 3 pgs..
Office Action from U.S. Appl. No. 11/644,715 mailed May 13, 2011, 10 pages.
Decision on Rejection from Chinese Patent Application No. 200710305369.3 mailed Aug. 25, 2011, 11 pgs..
Notification of Reasons for Refusal from Japanese Patent Application No. 2007-329080 mailed Mar. 21, 2012, 4 pgs..
Notification of Reasons for Refusal from Japanese Patent Application No. 2007-329080 mailed Oct. 25, 2011, 6 pgs..
Office Action from Taiwan Patent Application No. 096147243 mailed Jul. 15, 2011, 13 pgs..
Office Action from Taiwan Patent Application No. 096147243 mailed Dec. 30, 2011, 7 pgs..
Third Office Action from Chinese Patent Application No. 200710305369.3 mailed Jun. 25, 2012, 7 pgs..
Final Office Action from U.S. Appl. No. 11/644,715 mailed Feb. 22, 2010, 12 pgs..
Office Action from U.S. Appl. No. 11/644,715 mailed Jun. 10, 2009, 11 pgs..
Office Action from U.S. Appl. No. 11/644,715 mailed Nov. 9, 2010, 13 pgs..
Decision of Rejection from Taiwan Patent Application No. 096147243 mailed Aug. 27, 2012, 4 pgs..
Office Action from German Patent Application No. 10 2007 060 694.1 mailed Feb. 20, 2014, 3 pgs.

* cited by examiner

FLOATING BODY MEMORY CELL HAVING GATES FAVORING DIFFERENT CONDUCTIVITY TYPE REGIONS

CROSS-REFERENCE TO RELATED APPLICATIONS

This application is a divisional of U.S. patent application Ser. No. 13/534,985, filed Jun. 27, 2012, which is a divisional of U.S. patent application Ser. No. 11/644,715, filed Dec. 22, 2006, now U.S. Pat. No. 8,217,435, issued on Jul. 10, 2012, the entire contents of which are hereby incorporated by reference herein.

FIELD OF THE INVENTION

This invention relates to the field of dynamic, random-access memories (DRAMs), and devices with double gates, particularly those using transistors with floating bodies, also known as floating body cells (FBCs).

PRIOR ART AND RELATED ART

Most common DRAM cells store charge on a capacitor and use a single transistor for accessing the capacitor. More recently, a cell has been proposed which stores charge in a floating body of a transistor. A back gate is biased to retain charge in the floating body.

In one proposal, an oxide layer is formed on a silicon substrate and a silicon layer for the active devices is formed on the oxide layer (SOI substrate). The floating bodies are defined from the silicon layer and the substrate is used as a back or biased gate. One problem with this arrangement is the relatively high voltage required on the back gate because of the thick oxide. For this structure and others, when FBCs are scaled to state-of-the-art gate lengths, it is necessary to use either high voltage back gate bias or thinner back gate oxide to retain the extra holes in the body. The holes collected at the back gate interface depends on the back gate/flat-band potential difference and the gate oxide thickness. As the oxide is thinned, the gate leakage becomes high, causing the tunneling of electrons, which has the effect of erasing the stored charge.

Several structures have been proposed to reduce the relatively high bias potential discussed above, including use of a double gate floating body and silicon pillars. These structures are difficult to fabricate. This and other related technology is described at C. Kuo, *IEDM*, December 2002, following *M. Chan Electron Device Letters*, Jan 1994; C. Kuo, *IEDM*, December 2002, "*A Hypothetical Construction of the Double Gate Floating Body Cell;*" T Ohsawa, et al., *IEEE Journal of Solid-State Circuits*, Vol. 37, No. 11, November 2002; and David M. Fried, et al., "*Improved Independent Gate N type FinFET Fabrication and Characterization,*" *IEEE Electron Device Letters*, Vol. 24, No. 9, September 2003; *Highly Scalable FBC with 25 nm BOX Structure for Embedded DRAM Applications*, T. Shino, *IDEM* 2004, pgs 265-268; T. Shino, *IEDM* 2004, "*Fully-Depleted FBC (Floating Body Cell)with enlarged signal Window and excellent Logic Process Compatibility;*" T. Tanaka, *IEDM* 2004, "*Scalability Study on a Capacitorless 1T-DRAM: From Single-gate PD-SOI to Double-gate FinDRAM*; U.S. Patent Application 2005/0224878; and "Independently Controlled, Double Gate Nanowire Memory Cell with Self-Aligned Contacts," U.S. patent application Ser. No. 11/321,147, filed Dec. 28, 2005.

Another floating body memory formed on a bulk substrate is described in *Symposium on VLSI Technology Digest of Technical Papers*, page 38, 2005 by R. Ranica, et al. The floating p well, as described, is isolated from neighboring devices by a shallow trench isolation region and underlying n well. Drain disturbance occurs when devices on the same column are read or written. A parasitic bi-polar transistor between the source, drain and body; and between the source, body and n well, can cause charge loss under disturb conditions. As will be seen in one embodiment of the present invention, this problem is addressed. Other problems associated with the high voltage bias are also addressed.

BRIEF DESCRIPTION OF THE DRAWINGS

FIGS. 7-15 are generally through a section line corresponding to line 7-7 of FIG. 3, although unlike the SW substrate of FIG. 3, a bulk substrate is used.

DETAILED DESCRIPTION

In the following description, a memory and method for fabricating the memory is described. Numerous specific details are set forth, such as specific conductivity types, to provide a thorough understanding of the present invention. It will be apparent to one skilled in the art, that the present invention may be practiced without these specific details. In other instances, well known processing steps and circuits have not been described in detail, in order not to unnecessarily obscure the present invention.

Floating Body Cell Operation and Prior Art Devices

Figure 1:
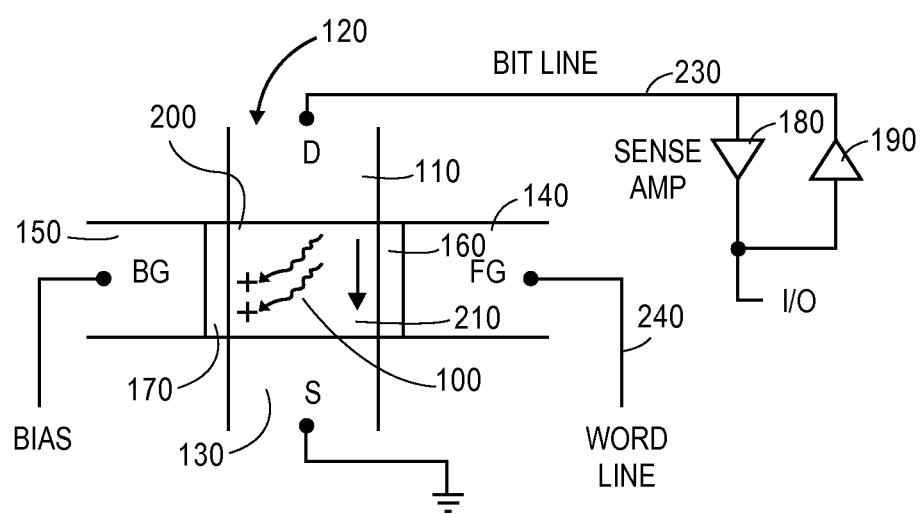
FIG. 1 is a plan view of a prior art floating body cell (FBC) and its connection to the peripheral circuits in a memory.

A single memory cell is shown in schematic form in FIG. 1. A portion of a semiconductor line, body or fin 120, formed on an oxide layer (such as BOX 250 of FIG. 2), and etched from, for example, a monocrystalline silicon layer is illustrated. The body 120 includes a pair of spaced-apart, doped regions 110 and 130, disposed at opposite ends of the body thereby defining a channel region 100. In one embodiment, the channel region is a p type region, and the source region 130 and drain region 110 are more heavily doped with an n type dopant. The channel region may be doped to two different doping levels adjacent to its opposite sides.

A pair of gates identified as a front gate 140 and back gate 150 are formed about the body 120. The gates 140 and 150 are insulated from the channel region 100 of the silicon body 120 by the oxide layers or high k dielectric layers 160 and 170, respectively. In FIG. 1 the gates are shown on opposite sides of the body to simplify the figure. A more accurate depiction of the cell is shown in perspective view in FIG. 2. The cell is typically formed in an array of cells in a memory.

The memory cell of FIG. 1 is a four-terminal device, coupled to the peripheral circuits of the memory. For the n channel embodiment illustrated, the source region is coupled to ground, and the back gate 150 is coupled to a source of bias (a constant potential), for example, −1 volt. The drain terminal 110 is connected to a bit line 230 in the memory. The front gate 140 is connected to a word line 240 in the memory, to allow selection of the cell. The cell, as will be described, is a dynamic, random access memory cell, and as such, the data stored requires periodic refreshing.

Assume first, that the cell of FIG. 1 is not storing charge, and that the cell is selected by the application of a positive potential to a word line which is coupled to the gate 140. Assume further, that a binary one is to be stored in (written into) the cell as represented by the storage of charge. (A binary 0 is represented by the absence of charge.) An amplifier 190 provides a positive potential to the bit line 230 causing conduction in the inversion channel 210 of the channel 100 of the body 120, as typically occurs in a field-effect transistor. As this occurs, hole generated from the impact ionization for an n channel embodiment (resulting generally from impact ionization) drift towards the gate 150, under the influence of the bias applied to this gate. These holes remain in the storage 200 of the body region 120 after the potential is removed from the word line 240 and the potential is removed from the bit line 230. Other charging mechanisms may be used to write data into a cell. For example, gate-induced drain leakage (GIDL) also creates electron/hole pairs at a different set of biases (VFG<O, Vd>0, VBG<0).

Assume that it is necessary to determine whether the cell is storing a binary 1 or binary 0. The cell is selected by the application of a positive potential to the word line 230. The threshold voltage of the cell shifts, depending on whether holes are stored in the region 200. The cell has a lower threshold voltage, that is, it conducts more readily, when there is charge stored in the region 200. This shift in threshold voltage is sensed by the sense amplifier 180 and provides a reading of whether the cell is storing a binary 1 or binary 0. The reading is provided to an I/O output line, or to refresh circuitry to refresh the state of the cell.

The threshold voltage of the cell may be determined by comparing the read current to a reference current in a cross-coupled sense amplifier. The reference current may be established by averaging over a pair of reference cells with one cell in state "1" and the other in state "0".

One characteristic for a dynamic memory cell is its retention time. This is the time between refresh cycles needed to restore the stored charge representing a binary state. Ideally, the retention time should be as long as possible to reduce the overhead associated with refreshing the cells and to provide longer periods during which the cells may be accessed. Ideally, the retention time should be increased without negatively impacting other cell characteristics such as read voltage, cell size, etc. As will be seen below, improved retention time is obtained without an increase to the cell size or its bias voltage. This is achieved by asymmetrical gate structures, as will be described.

Figure 2:
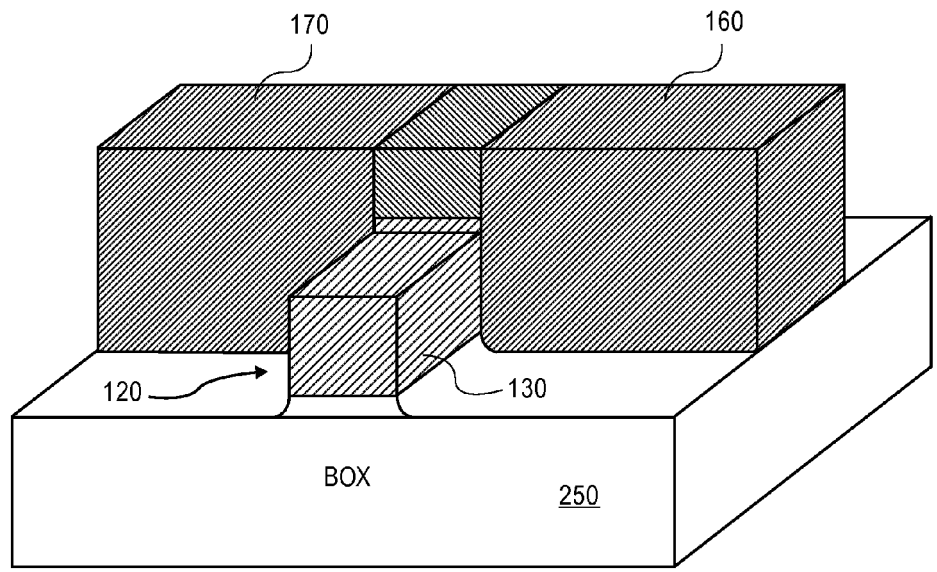
FIG. 2 is a perspective view of a prior art FBC fabricated on a silicon-on-insulator (SOI) substrate.

In one prior art FBC, the cell is fabricated on a BOX 250 of FIG. 2; BOX 250 is formed on a silicon substrate not illustrated. Active devices for the memory are fabricated in, for instance, a monocrystalline silicon layer, disposed on the BOX 250. This SOI substrate is well-known in the semiconductor industry. By way of example, it is fabricated by bonding a silicon layer onto a substrate, and then, planarizing the silicon layer so that it is relatively thin. This relatively thin, low body effect layer, is used for active devices. Other techniques are known for forming the SOI substrate including, for instance, the implantation of oxygen into a silicon substrate to form a buried oxide layer. In the prior art device of FIG. 2, the gates 140 and 150 are illustrated along with the fins 120 and source region 130.

Embodiment of FBC with Asymmetrical Gate Structure and its Benefits

Figure 3:
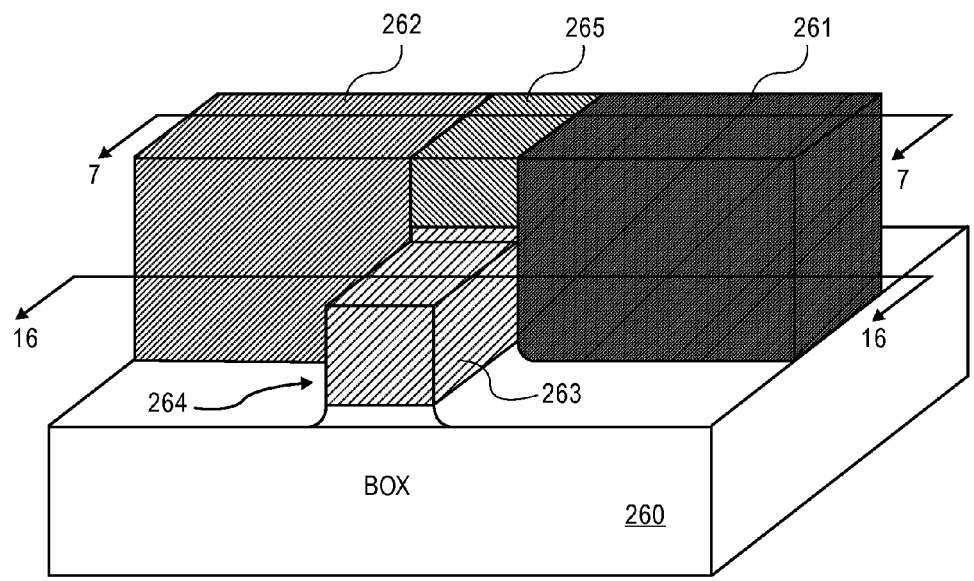
FIG. 3 is a perspective view of a FBC in accordance with one embodiment of the present invention, fabricated on a SOI substrate.

Referring now to FIG. 3, in one embodiment of the FBC, a fin 264 is fabricated on a buried oxide 260. A source region 263 of the fin 264 is illustrated. A front gate 261 and back gate 262 are shown separated by a silicon nitride member 265. Unlike the structure of FIG. 2, in FIG. 3 the gate structures 261 and 262 are different. The work function of the metals for each of the gates is different and/or the gate oxide thicknesses are different. For an n channel embodiment, the gate 261 can be an n+ doped polysilicon gate or a metal having a work function favoring an n channel device, while the gate 262 can be a p+ doped polysilicon gate or a metal having a work function favoring a p channel device. Below these gates are referred to as an n+ gate and p+ gate, respectively. When fabricated from metal, a high-k dielectric is typically used.

A gate dielectric having a high dielectric constant (k), such as a metal oxide dielectric, are for instance, $HfO_2$ or $ZrO_2$ or other high k dielectrics, such as PZT or BST. (Referred to below as gate oxides.) The gate dielectric may be formed by any well-known technique such as atomic layer deposition (ALD) or chemical vapor deposition (CVD). Alternately, the gate dielectric may be a grown dielectric. For instance, the gate dielectric, may be a silicon dioxide film grown with a wet or dry oxidation process.

For an n channel embodiment, the p+ gate has a thicker oxide to prevent the transmission of charge and hence, improve retention. Moreover, no source/drain tip implant region is formed on the back gate side of the fin.

The metal gate is formed over the gate oxide. In one embodiment, a gate material comprises a metal film such as tungsten, tantalum, titanium and/or nitrides and alloys thereof. For the n channel device, a work function in the range of 3.9 to 4.6 eV may be used. For the p channel device, a work function of 4.6 to 5.2 eV may be used. Accordingly, for substrates with both n channel and p channel transistors, two separate metal deposition processes may need to be used. The remainder of the gate may be of another metal or polysilicon, as occurs in one embodiment below.

Figure 4:
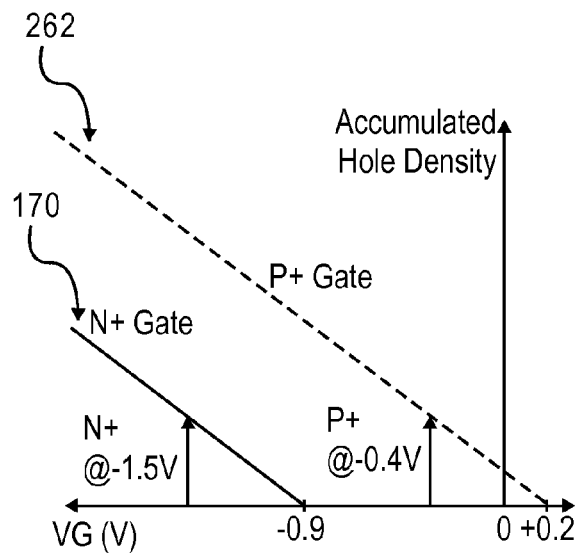
FIG. 4 is an energy diagram showing the accumulated hole density for different back gate biases for an n+ work function gate and a p+ work function gate.

A comparison of the hole accumulations for the devices of FIGS. 2 and 3 is shown in FIG. 4. The arrow 150 points to a line representing the hole accumulation associated with the gate 150 of FIG. 2 as a function of gate voltage. The backgate 150 is assumed to be an n+ gate. Similarly, the arrow 262 points to the line associated with the hole accumulation for the gate 262 of FIG. 3. The backgate 262 is assumed to be a p+ gate. Assume a voltage of −1.5 volts on the gate 150 of FIG. 2, the same hole density can be achieved with a voltage of only −0.4 volts for the gate 262 of FIG. 3. The p+ gate attracts substantially more holes for a given voltage than its counterpart n+ gate of FIG. 2.

Figure 5:
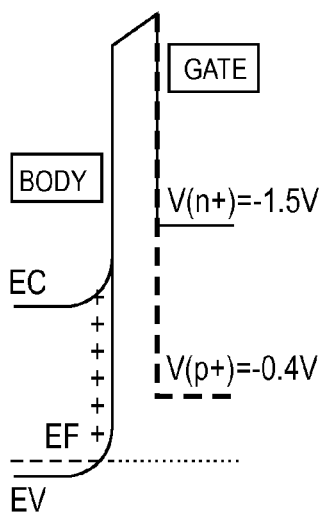
FIG. 5 is a diagram showing the Wentzel-Kramers-Brillouin (WKB) approximation used to calculate the transmission probability of electrons from the gate to floating body of FIG. 6.
Figure 6:
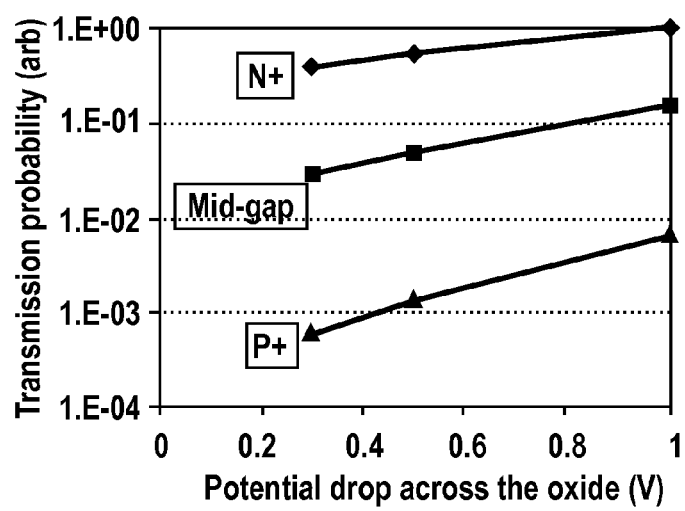
FIG. 6 is a diagram showing the potential across the back gate oxide versus the transmission probability of electrons.

The WKB approximation of FIG. 5 of the tunneling barrier from the body to the gate was used to develop the transmission probability versus voltage graph of FIG. 6. In FIG. 6, the probability of charge transfer that effectively erases the stored charge is illustrated. FIG. 6 illustrates three approximations: one for a p+ gate, another for an n+ gate, and the intermediate case with a mid-gap gate. As can be seen, the transmission probability is about four orders of magnitude higher for the n+ gate which would be the case for the embodiment of FIG. 2 when compared to using the p+ gate of FIG. 3. Even the mid-gap gate provides an improvement of two orders of magnitude. The transmission probability bears directly on the retention time. With a lowered electron transmission probability, the retention time in the FBC is improved as in the case of the p+ back gate in an n channel FBC.

One challenge in realizing the structure of FIG. 3, particularly where the fins are formed in an array at the critical dimension of a process, is masking for the fabrication of two different gate oxides and/or gate materials. Because perfect alignment is seldom achievable in a masking process, some mechanism is generally used to compensate for misalignments. As will be described below, compensation is provided for misalignments, thereby permitting the fabrication of the device of FIG. 2, at the smallest geometries associated with a given process. Moreover, as will be described below, the FBCs are fabricated on the same bulk substrate as the logic devices.

Fabrication of FBC with Asymmetrical Gate Structures

The described processing below focuses on the fabrication of FBCs in a memory array. While the array is fabricated on one section of an integrated circuit, the peripheral circuits for the memory or other logic circuits such as would be used for a processor are fabricated on other sections. Moreover, while the description below is directed to the fabrication of the cell on a bulk substrate, other substrates may be used such as SOI substrate shown in FIG. 3.

Figure 7A:
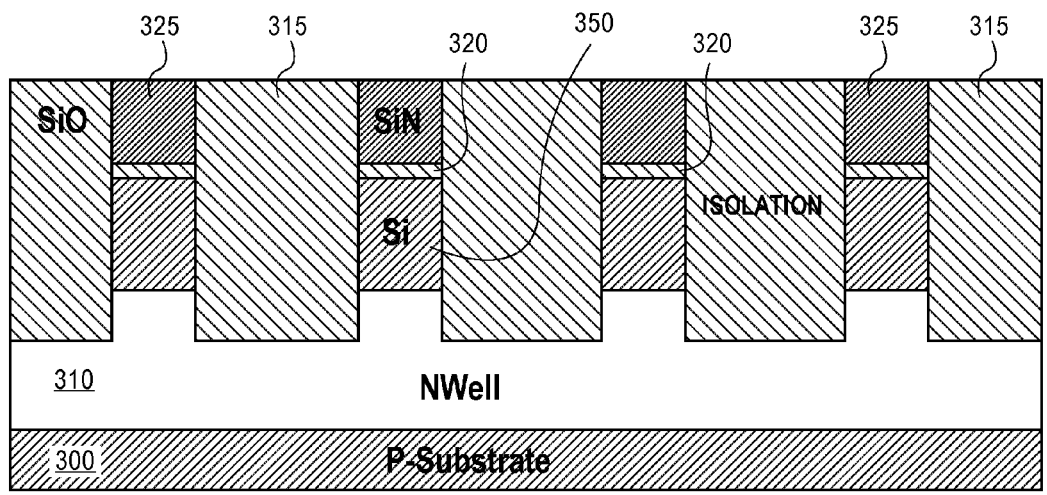
FIG. 7A is a cross-sectional, elevation view of a substrate where fins for FBCs separated by isolation regions are defined in an n well.
Figure 7B:
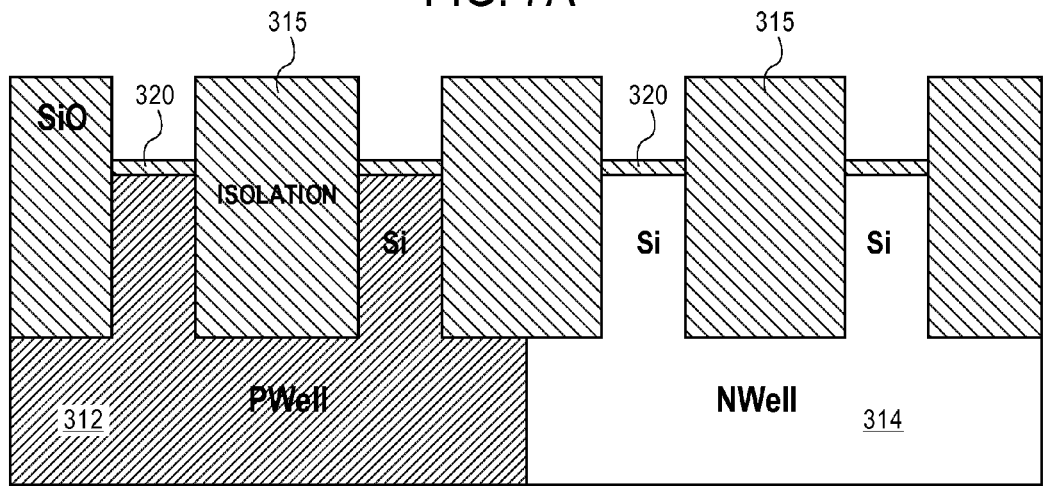
FIG. 7B is a cross-sectional, elevation view of a different section of the substrate of FIG. 7A, where isolation regions are formed in a p well and in an n well; this section of the substrate is used for the fabrication the logic CMOS transistors.

FIG. 7A illustrates a section of the p type substrate 300 upon which the FBCs and logic circuits are fabricated. The substrate for this embodiment is an ordinary monocrystalline p type silicon (bulk) substrate. (Note the term "floating" body is used for bodies formed on bulk, even though such bodies are not intuitively floating as they are with an SOI substrate.) The memory devices are fabricated in an n well 310 formed below the upper region of the substrate which remains p type. FIG. 7B illustrates other portions of the substrate. P wells 312 are formed where n channel transistors are to be fabricated. N wells 314 are formed where p channel transistors are to be fabricated. It will be appreciated that the n wells 310, p wells 312, and n wells 314 may be dispersed on the substrate so that logic transistors of the desired conductivity type can be placed where needed.

The substrate 300 has a pad oxide 320, initially grown on the substrate, as is typically done. Then, a silicon nitride layer is deposited on the substrate, masked and etched to form hard masking members 325, shown in FIG. 7A, and corresponding members not shown in FIG. 7B. These members are used to allow definition of fins both in the memory array section, as well as in the logic section. Ordinary trench processing is used to form the trenches 315 between the nitride members 325, again both in the memory section and logic section of the substrate. A planarization step is used to provide the flat surfaces shown in FIGS. 7A and 7B. Following this, the silicon nitride members are removed, only in the logic section. This is the point in the processing shown in FIGS. 7A and 7B.

Figure 8A:
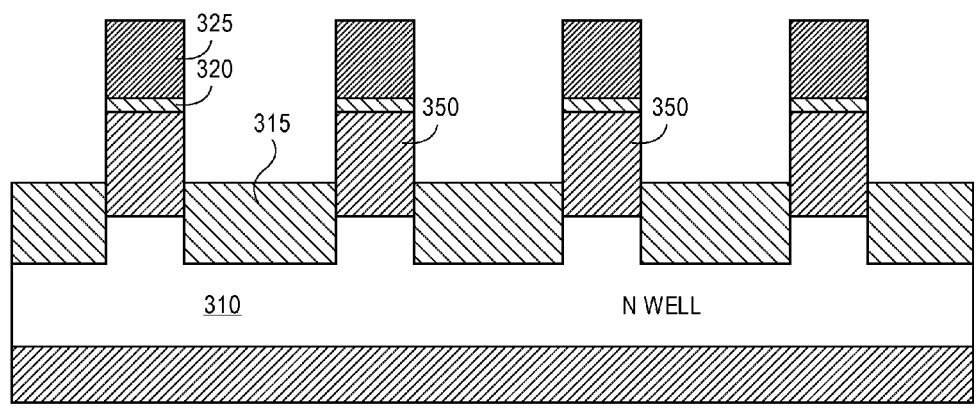
FIG. 8A illustrates the structure of FIG. 7A, after the isolation regions are etched.
Figure 8B:
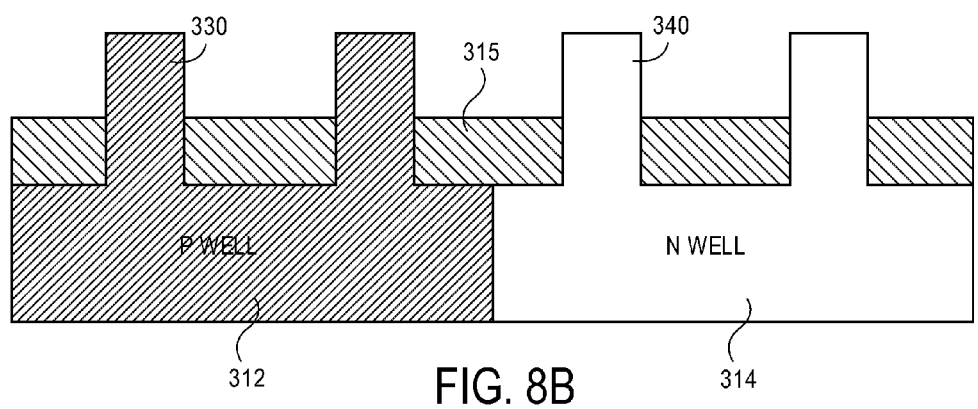
FIG. 8B illustrates the structure of FIG. 8A, after the isolation regions are etched.

Next, as shown in FIGS. 8A and 8B, a plasma (dry) etching step is used to etch back the trench oxide regions 315 of FIGS. 7A and 7B. This is a timed etch, leaving some of the trench isolation 315, as shown in FIGS. 8A and 8B. When this occurs, the fins 350 of FIG. 8A are revealed. These fins are used for the FBCs. Similarly, fins 330 in the p well 312 and fins 340 in the n well 314 are similarly revealed. Note that this etching step also removed the oxide 320 in the logic section, whereas the oxide 320 remains in the memory section because of the protection from by the silicon nitride members 325. The fins 330 are used for the n channel logic, tri-gate transistors, whereas the fins 340 are used for the p channel logic tri-gate transistors.

Figure 9A:
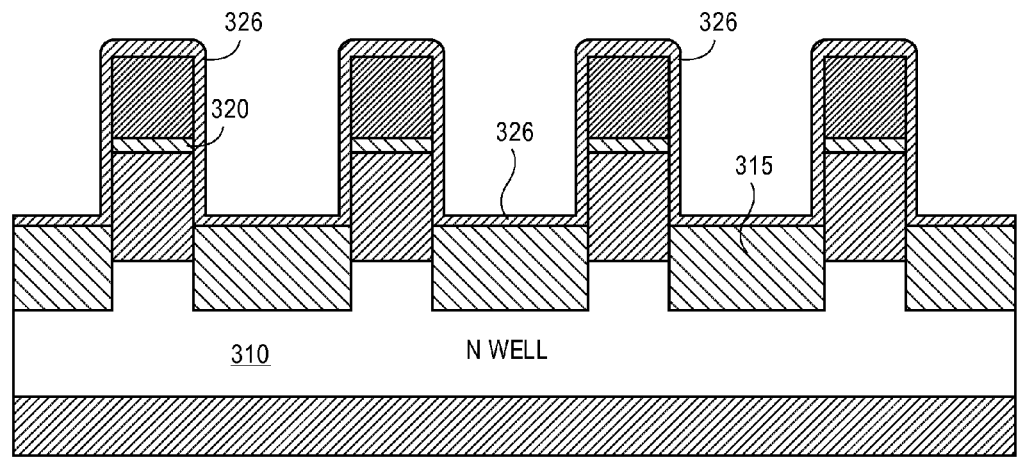
FIG. 9A illustrates the structure of FIG. 8A, after a dielectric layer is formed.
Figure 9B:
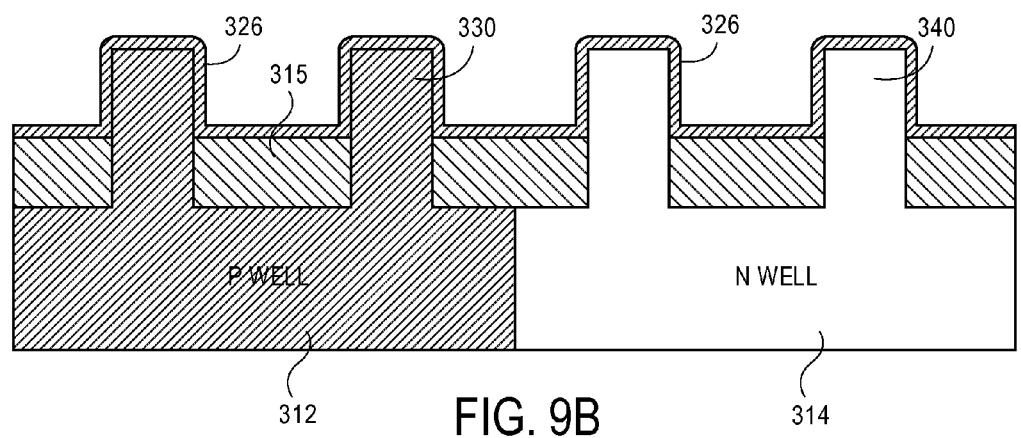
FIG. 9B illustrates the structure of FIG. 8B, after a dielectric layer is formed.

Referring now to FIGS. 9A and 9B, a first gate dielectric layer 326 is formed with a blanket deposition over the entire substrate. A grown oxide may instead be used. In one embodiment, this is a deposited layer of silicon dioxide or other oxides. As will be seen, this dielectric layer is subsequently removed except where the back gates of the FBCs are formed, and it is this layer which provides the extra thickness of insulation for the back gate.

A sacrificial light absorbing material (SLAM) layer 360 is now formed over the entire substrate using, for instance, a spin-on process. Other sacrificial layers may be used instead of a SLAM. The SLAM 360 is shown in both FIGS. 10A and 10B after it has been planarized.

Figure 11A:
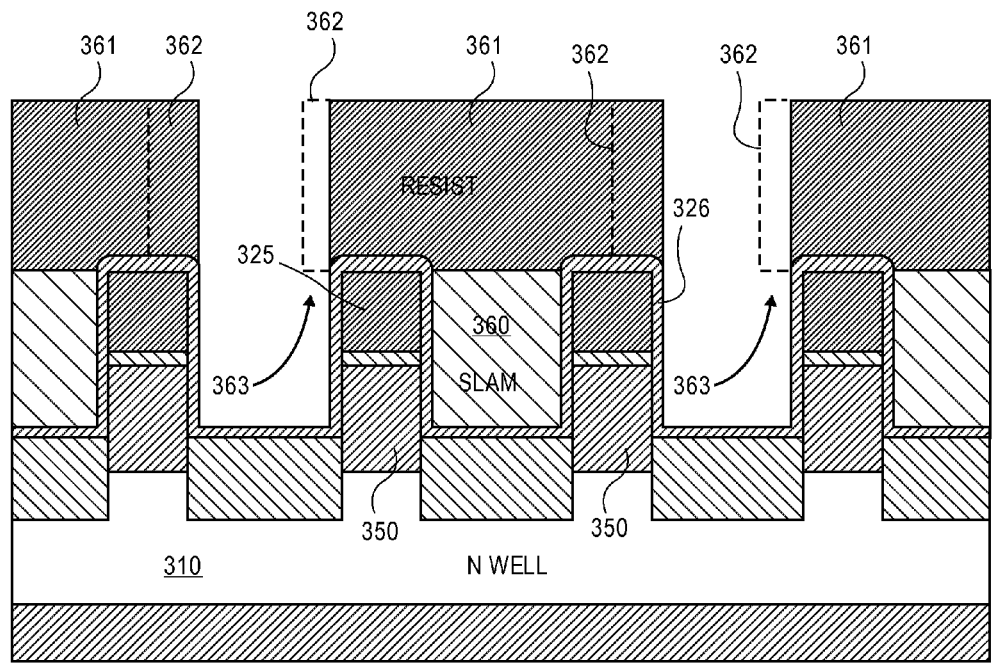
FIG. 11A illustrates the structure of FIG. 10A, after a masking step.
Figure 11B:
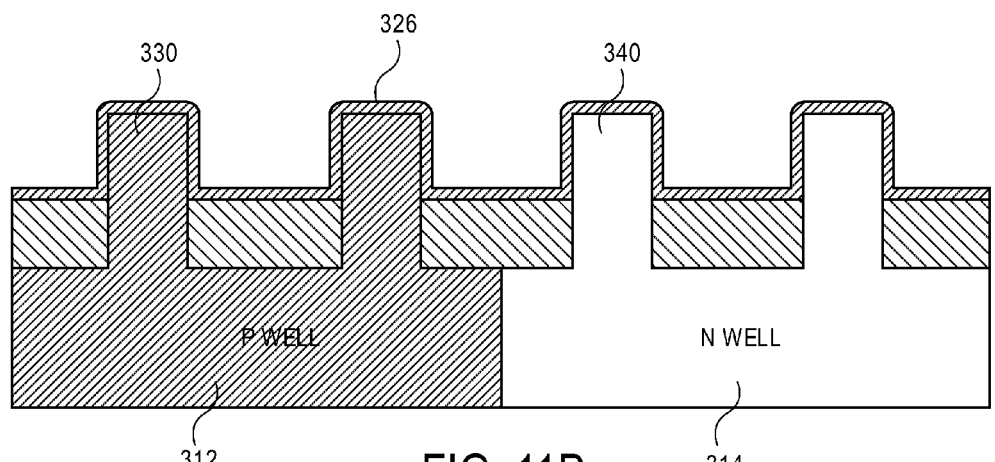
FIG. 11B illustrates the structure of FIG. 10B, after removal of the SLAM layer.

As illustrated in FIG. 11A, masking members 361 are formed from a photoresist layer over adjacent pairs of the fins 350 in the array section of the substrate. The masking members 360 leave exposed the region between every other fin in the memory array section. No masking members are formed at this time in the logic section of the array. Next, the exposed SLAM layer is etched with an ordinary wet etchant, leaving the structure shown in FIGS. 11A and 11B.

It should be noted in FIG. 11A, that it will be difficult to precisely align the masking members 361 with the edges of the fin structures. More typically, the mask will not be in perfect registry with the underlying fins. The dotted lines 362 in FIG. 11A show a typical mask alignment, with the mask shifted to the left with respect to the underlying structure. Because a wet etchant is used, the SLAM nonetheless be removed in the region shown by the arrows 363. This tolerance for mask misalignment allows, as will be seen, a practical process for providing different gate structures on opposite sides of each FBC.

Figure 12A:
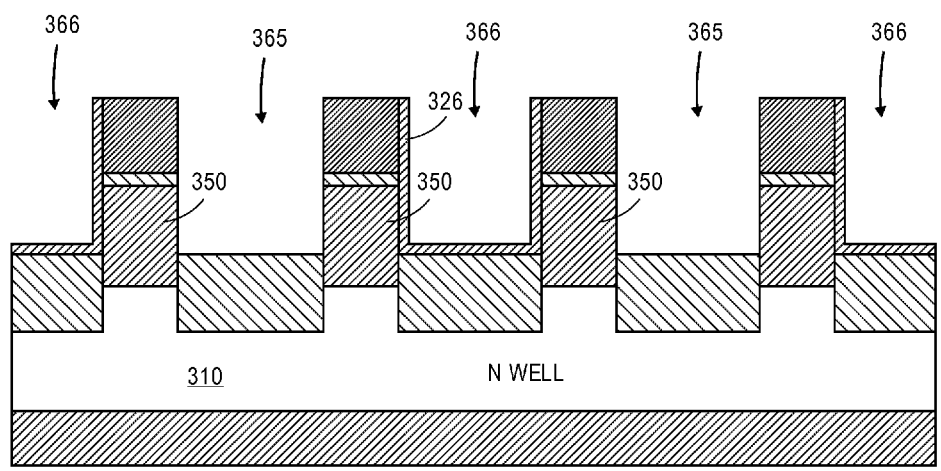
FIG. 12A illustrates the structure of FIG. 11A, after etching steps which selectively remove the SLAM layer and underlying oxide layer, and which remove masking members and remaining SLAM.
Figure 12B:
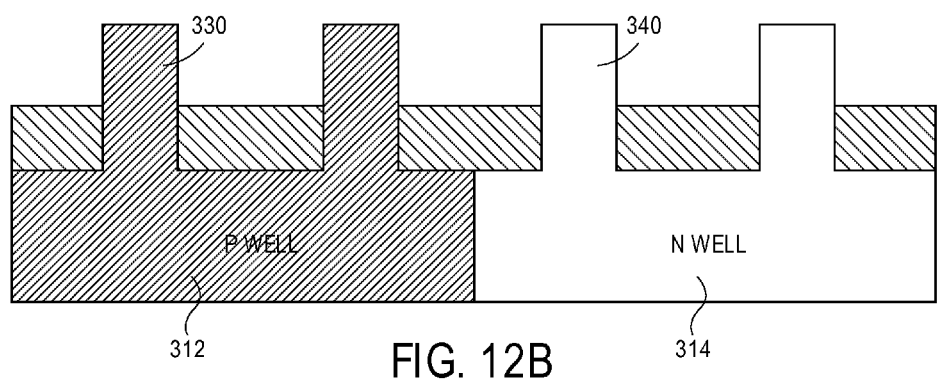
FIG. 12B illustrates the structure of FIG. 11B, after removal of the oxide layer.

Now, the photoresist members 361 are removed and a wet etching step follows to remove all exposed oxide, both in the array section and the logic section of the substrate. Note, if the oxide used is SiO$_2$ it is removed prior to the removal of the members 361. If the oxide is a high-k material, it may be removed after the members 361 are removed. Then, the remaining SLAM is removed resulting in the structure shown in FIGS. 12A and 12B. In FIG. 12A, it can be seen that the oxide 326 remains between alternate pairs of the fins 350, shown as regions 366, and no oxide remains between the intermediate regions 365 shown in FIG. 12A. Thus, looking at the parallel, spaced-apart fins of FIG. 12A, the surfaces facing each other from two adjacent fins have a dielectric (within regions 366), whereas the next two facing surfaces with regions 365 do not have a dielectric. As will be described, the regions 366 are used for the back gates for the FBCs. The FBCs are arranged such that one cell has its back gate on the right of the fin, and the next cell has its back gate on the left of the fin. No oxide remains on the fins 330 and 340 in the logic section, as shown in FIG. 12B.

Figure 13A:
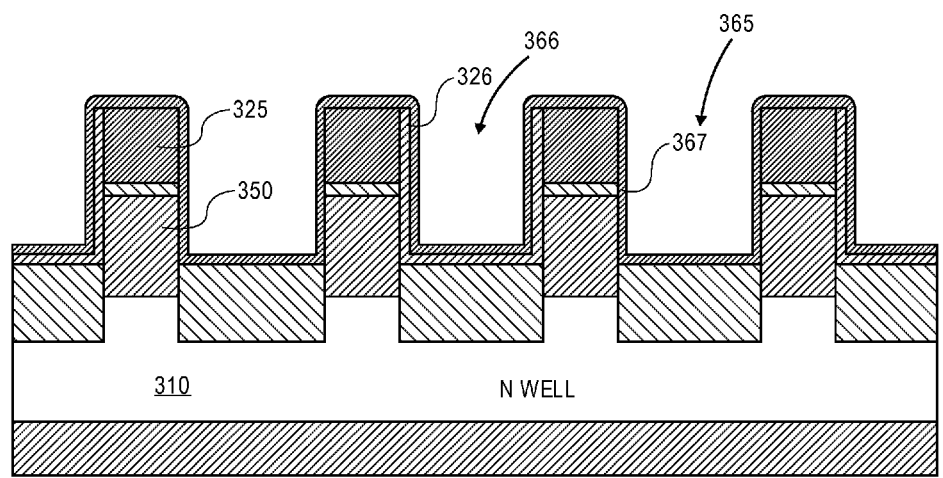
FIG. 13A illustrates the structure of FIG. 12A, after the formation of an additional oxide layer.
Figure 13B:
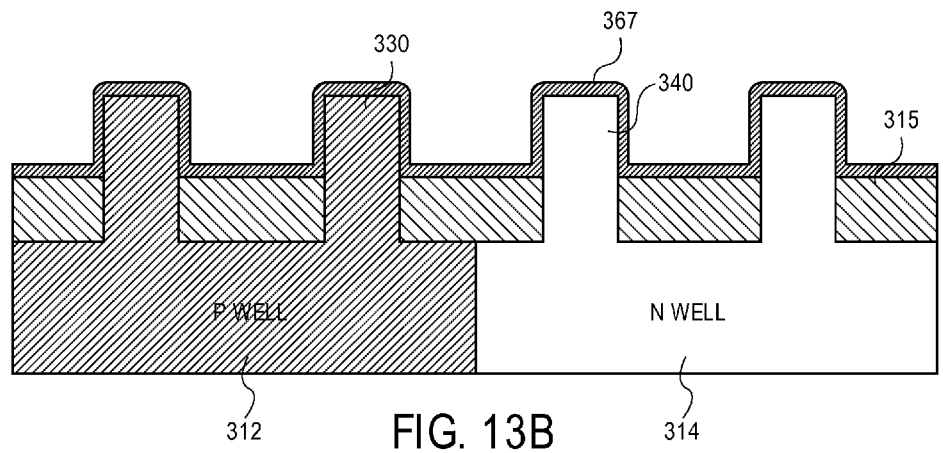
FIG. 13B illustrates the structure of FIG. 12A, after formation of an oxide layer.

A gate oxide 367 is next formed over the entire substrate, this oxide will be the gate oxide for both the p and n channel transistors in the logic section, and the gate oxide for the front gates of the FBCs (see FIGS. 13A and 13B). Again, this oxide may be any insulator such as a high-k material previously discussed. For the back gate (regions 366) of the FBCs, there are now two oxide layers 326 and 367, thus providing the thicker oxide needed to prevent the transfer of charge as shown in conjunction with FIGS. 5 and 6.

Figure 14A:
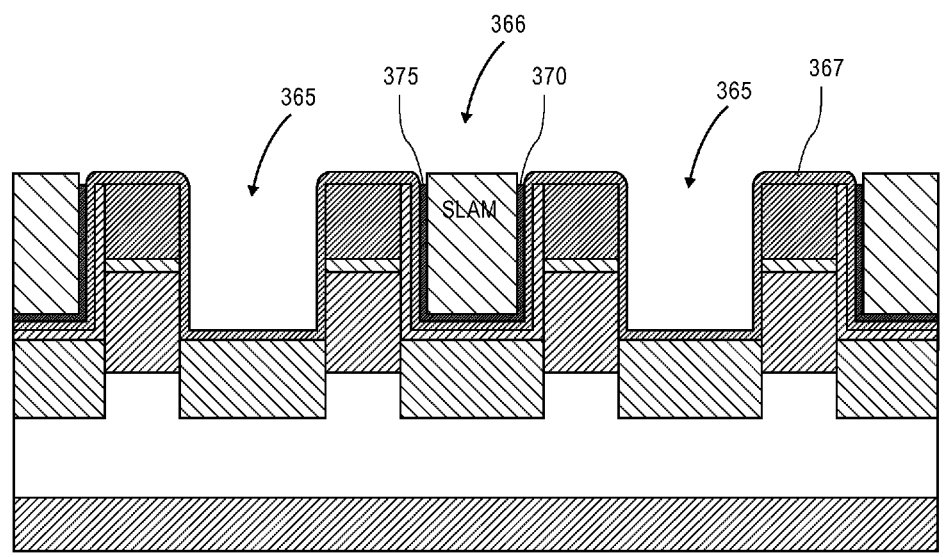
FIG. 14A illustrates the structure of FIG. 13A, after another masking step and SLAM etching step and the removal of p metal from exposed regions.
Figure 14B:
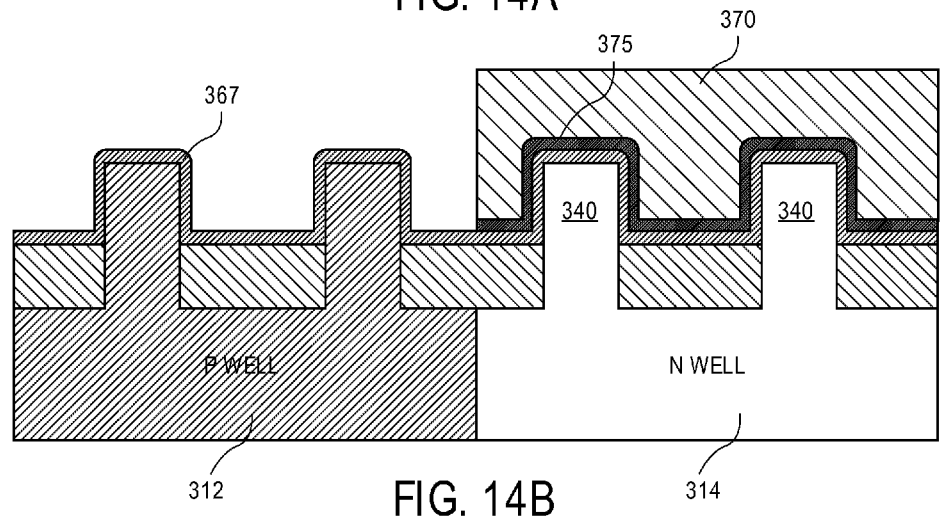
FIG. 14B illustrates the structure of FIG. 13B, after removal of the p metal from the p well region.

A blanket deposition of a gate metal layer with a work function appropriate for a p type device or a polysilicon p-doped polysilicon gate layer is now formed over the entire substrate, including both the memory section and the logic section. Layer 375, if a metal is used, has a work function appropriate for a p channel device (e.g. 4.6 to 5.2 eV) to obtain the benefits described in connection with FIG. 4. Then, another SLAM layer is deposited and the substrate is planarized. The masking step shown in FIG. 11A is again repeated. However, this time, masking members are also formed over the n well 314 so as to protect the p metal for the p channel transistors. A wet etch is again used to remove the exposed SLAM and the p metal which is not protected by the SLAM. To allow tighter design rule, the SLAM may be first etched with a dry etch, followed by a wet etch to reduce the space required between the pmos and nmos if it were all wet etched. The resultant structure is shown in FIGS. 14A and 14B. In FIG. 14A, the resultant SLAM members 370 in the memory section protect the regions 366. As can be seen beneath the SLAM 370, there is a p metal layer 375. Similarly, the SLAM masking member 370, covering the n well structures of the logic section, protect the p metal 375 which will subsequently be used for the gates of the p channel transistors.

The metal gate material 375 is shown extending continuously over two adjacent fins 340 in FIG. 14B. Later in the processing, a gate is formed over contiguous fins in p well 312. Most often in the logic section of the substrate the gates are formed so that they extend only over a single fin so as to form individual transistors. In some cases, a single gate drives two or more transistors, as shown. It will be appreciated that the spacing of the fins can be varied or other processing used to form individual tri-gate transistors in the logic section.

Following formation and selective etching of layer 375, what remains of the SLAM 370 is removed. An n metal gate material is now deposited over the substrate. This metal is deposited over the p metal as well as over the gate oxide for the n channel devices. The work function for the p metal remains unaffected by the overlaying of the n metal for the p channel devices and for the back gate of the FBCs.

Figure 15A:
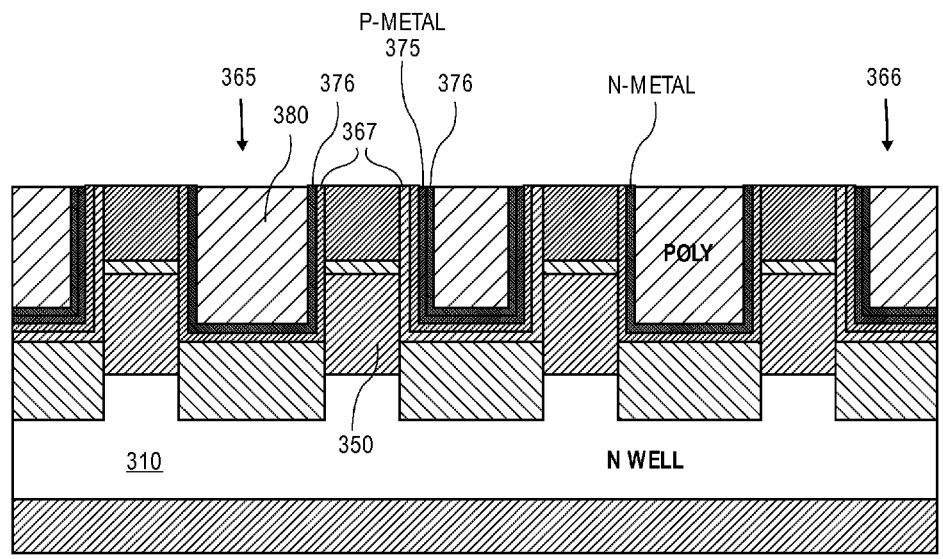
FIG. 15A illustrates the structure of FIG. 14A, after deposition of an n metal layer, polysilicon layer and planarization.
Figure 15B:
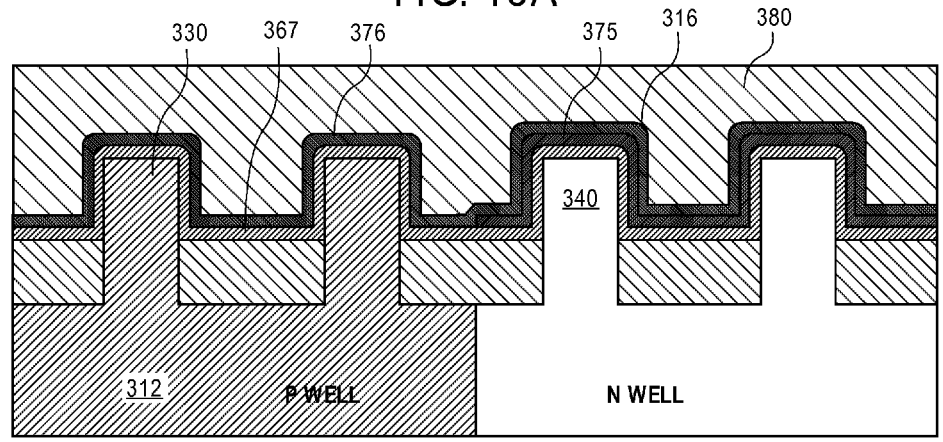
FIG. 15B illustrates the structure of FIG. 14B, after deposition of an n metal layer, polysilicon layer, and planarization.

Next, there is a blanket deposition of a polysilicon layer 380, followed by planarization, resulting in the structure shown in FIGS. 15A and 15B. After Planarization, the gate can be patterned to a desired gate length in the direction perpendicular to the cross section shown in the figures. Note in the regions 366, the back gates of the FBCs have two layers of oxide (326 and 367) and two metal layers, first the p metal 375 and the overlying n metal 376. In the regions 365, the front gate of the FBCs, there is only a single layer of oxide 367 and a single layer of the n metal 376. Each back gate serves two adjacent cells, and similarly, each front gate serves two adjacent cells.

Figure 16A:
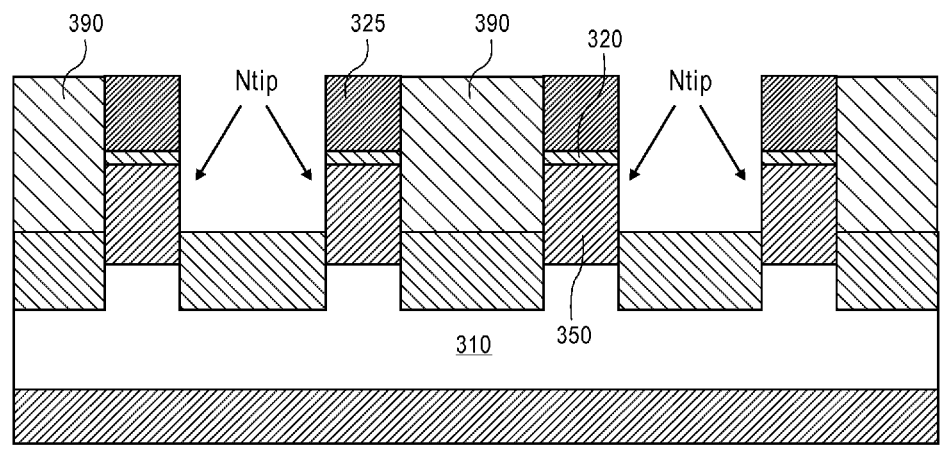
FIG. 16A is a cross-sectional, elevation view of the structure shown in FIG. 15A, however, taken spaced-apart from the gate regions (generally through a section line corresponding to line 16-16 of FIG. 3), and after another masking step, SLAM etching step, and during tip ion implantation.
Figure 16B:
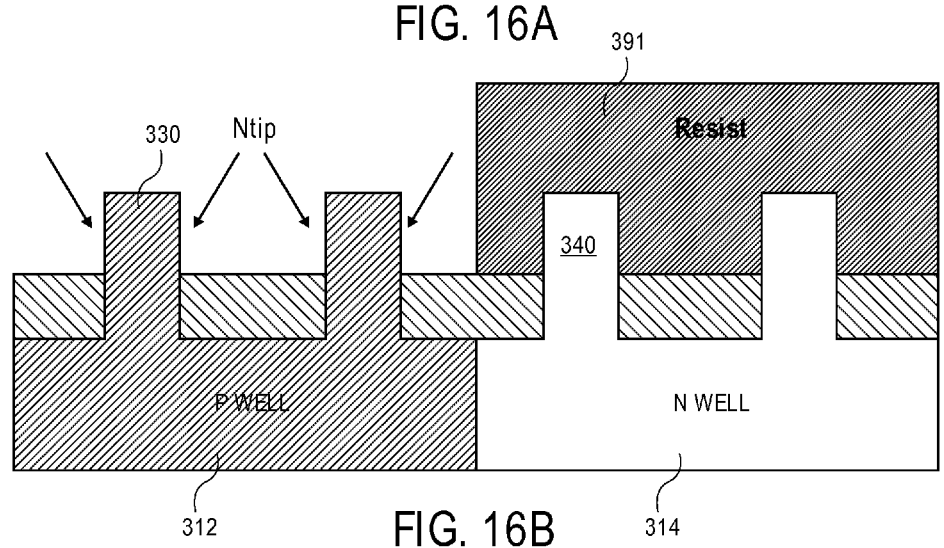
FIG. 16B illustrates the structure of FIG. 15B, taken spaced-apart from the gate regions during tip ion implantation.

Referring again to FIG. 3, the processing described for FIGS. 7-15 involve the formation of the gate structures in the array section, and corresponding gate structures in the logic section. Hence, the views in these figures are through the gate regions. FIGS. 16A and 16B are cross-sectional, elevation views, however, taken through the region of the fin, spaced apart from the gates as generally shown by section line 16-16 of FIG. 3. Note that at the stage of the processing shown in FIG. 16A, the oxide layer 320 and silicon nitride layer 325 is still on the fins, and as will be seen, this helps facilitate a tip implant.

Figure 10A:
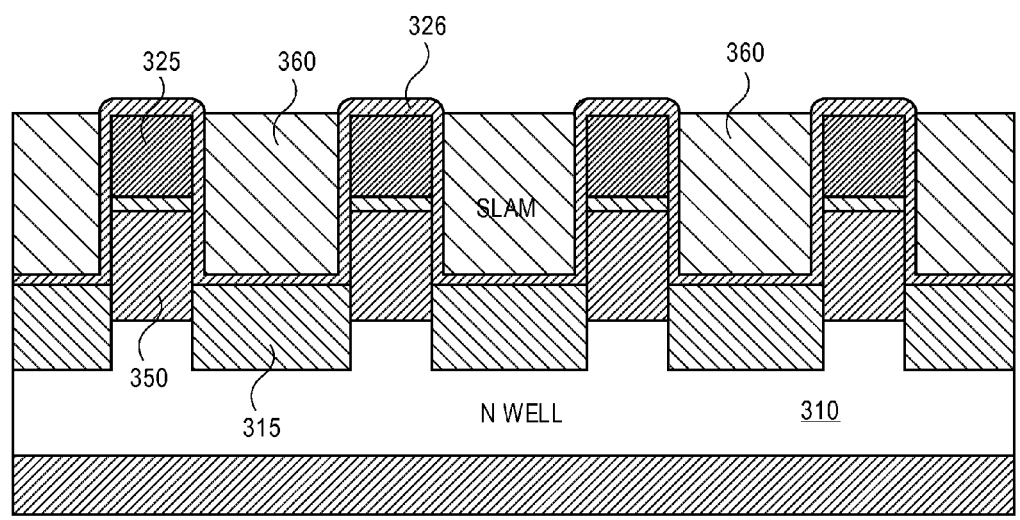
FIG. 10A illustrates the structure of FIG. 9A, after the formation and planarization of a SLAM layer.
Figure 10B:
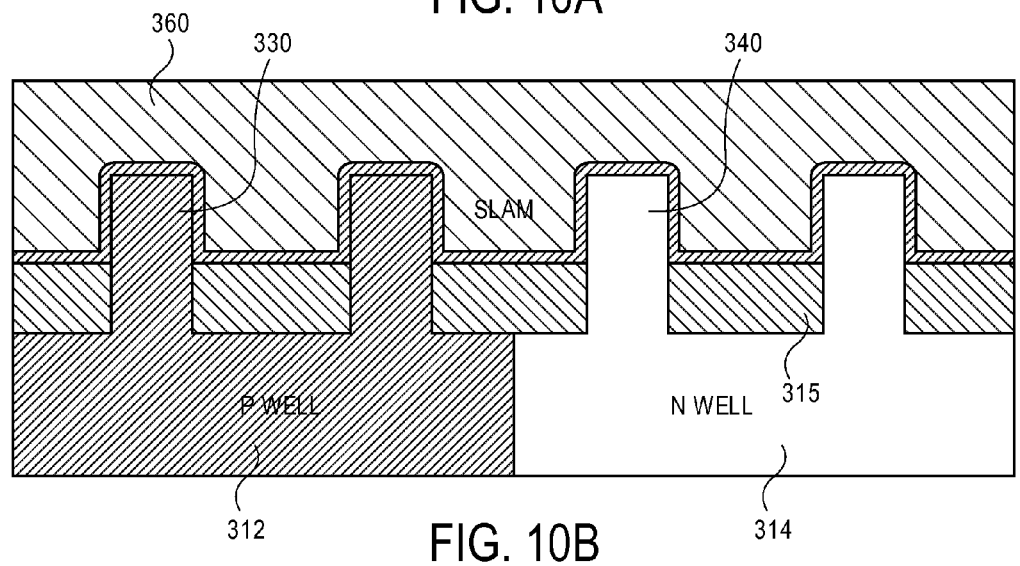
FIG. 10B illustrates the structure of FIG. 9B, after the formation and planarization of a SLAM layer.

Now, the SLAM and masking step of FIGS. 10A and 11A are repeated to form the SLAM members 390 shown in FIG. 16A. Also, an ordinary photoresist layer 391 is masked and etched over the n well logic section of the substrate to protect the sites of p channel devices. Two angled ion implantation steps are used to form the n type tip source and drain regions, as shown in FIGS. 16A and 16B. Because of the members 390, only one side of the fins 350 are implanted, this side corresponding to the region adjacent the front gates of the FBCs. These tips implanted regions in the fins 350 alternate between the right and left sides of the fins because of the back-to-back arrangement of the cells as described above.

Ordinary processing is next used to fabricate tri-gate and dual-gate devices in the logic and memory sections, respectively, including tip implant for the p channel devices in the logic section, halo implants (if used), and formation of spacers to allow the doping of the main source and drain region for both the n channel and p channel devices.

Figure 17:
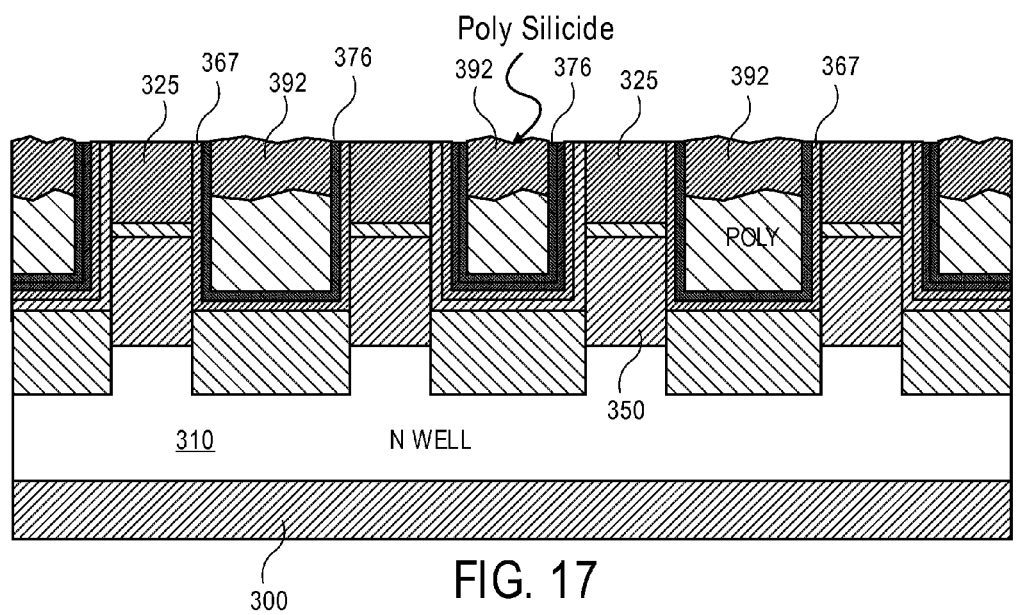
FIG. 17 is a cross-sectional, elevation view of the FBCs following the formation of silicide, generally through a section line corresponding to section line 7-7 of FIG. 3.

Finally, as shown in FIG. 17, a silicide or salicide is formed on the polysilicon to complete the front and back gates.

Several alternative processing, steps and orders of steps, may be used to provide the above-described structure. For instance, while as shown in FIG. 13A, the thick oxide 326 was formed followed by the thinner oxide 367, these processes may be reversed. The thin oxide 367 can be first formed, and the SLAM layer used to protect it, while a thicker oxide, is formed for the back gates. Similarly, while in FIGS. 14A and 14B, the p metal gate was first formed and then protected by the SLAM layer where needed, the n metal gate could first be formed and protected by the SLAM layer for the n channel devices followed by the formation of the p metal. Other alternative processing steps and orders may be used with the above-described process.

Embodiment with Bottom Back Gate and Top Transistor

Figure 18:
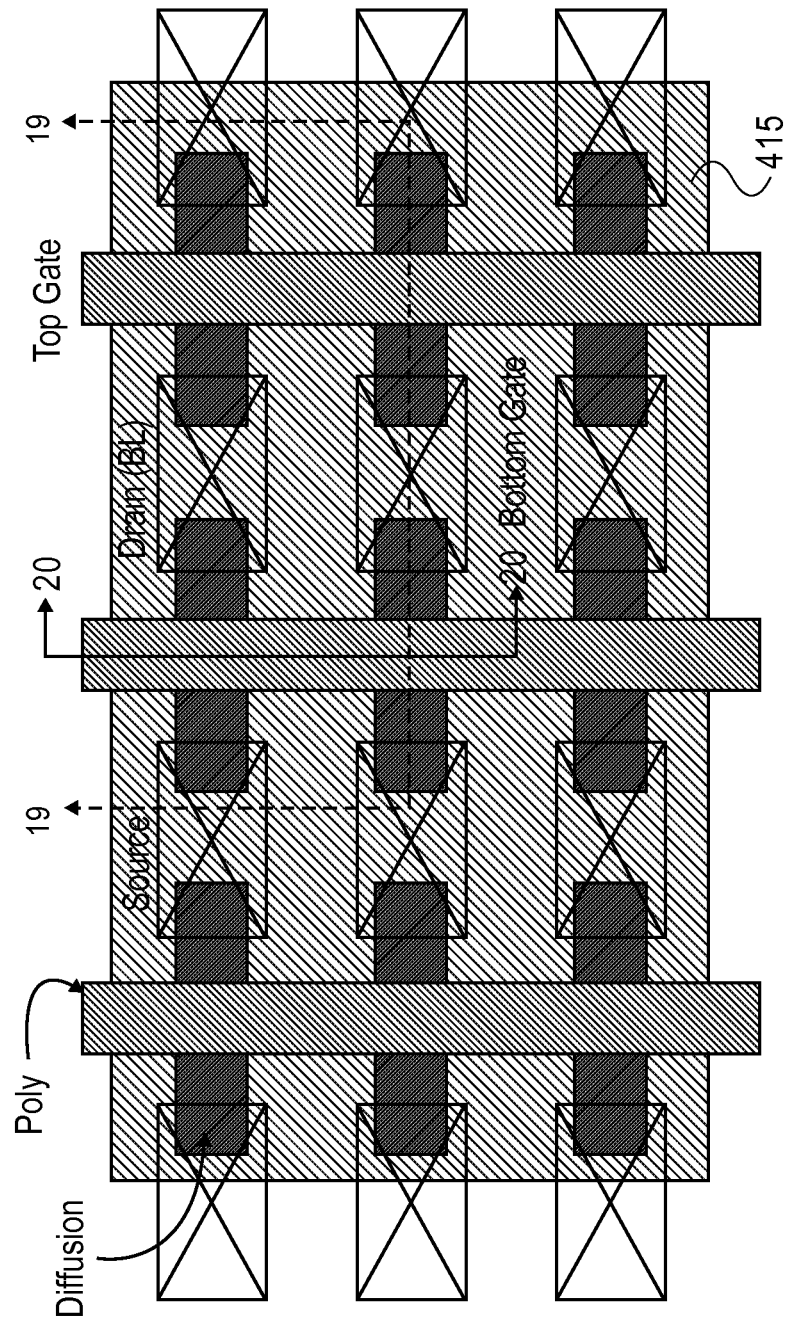
FIG. 18 is a plan view of another embodiment of a memory employing FBCs, where different oxide thickness and a bottom gate with a different work function than a top gate are used.

FIG. 18 is a plan view of an alternate embodiment where the memory array includes a bottom gate which performs the functions of the back gate, for the previously described embodiments. The bottom gate 415 of FIG. 18 surrounds the fins as will be seen, and is biased to retain the holes within the FBCs. A top gate functions as the word line for the FBCs; the bit lines are connected to the drains in a direction orthogonal to the word lines. Individual cells need not be isolated from each other, however, diffusion isolation may be used with a small impact on layout area using a cut mask. Even with the isolation between transistors, cell areas can be realized smaller than those associated with independent double-gates, due to the elimination of contacts to the back gate and front gate for each cell or cell pair. Moreover, only two metal layers are needed to connect the array, in part, because there is no need for separate gate contacts per cell or cell pairs.

Figure 19:
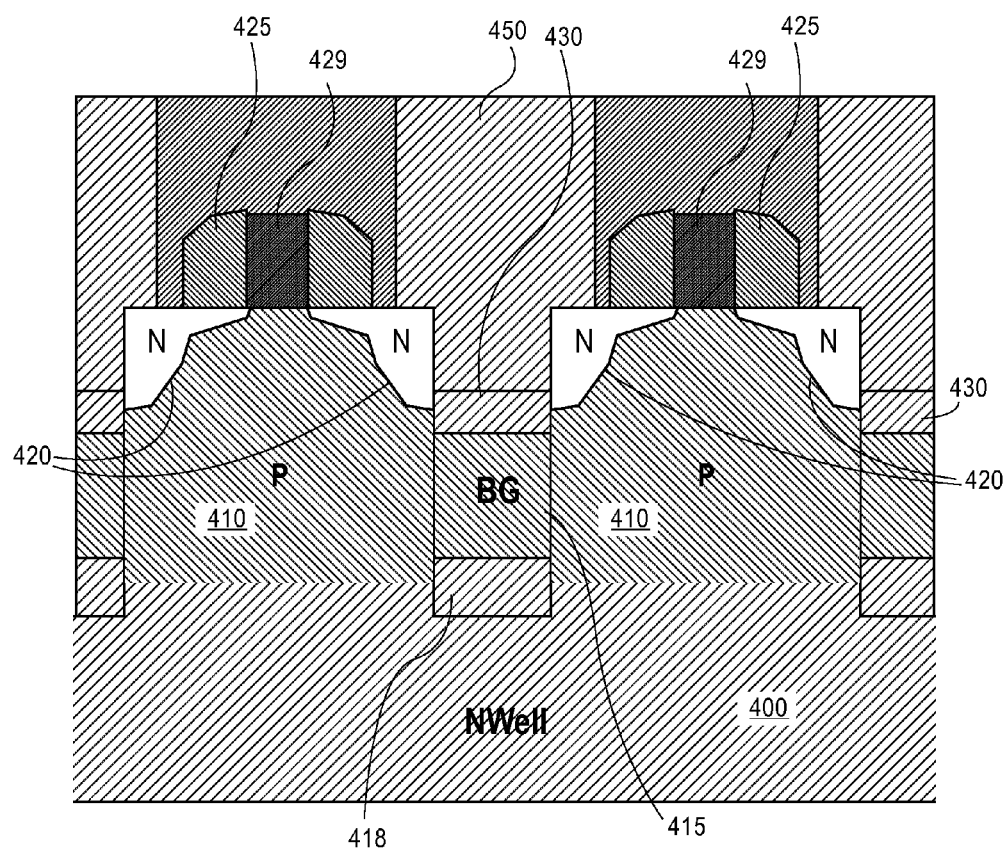
FIG. 19 is a cross-sectional, elevation view through two cells in the memory, taken through section line 19-19 of FIG. 18.
Figure 20:
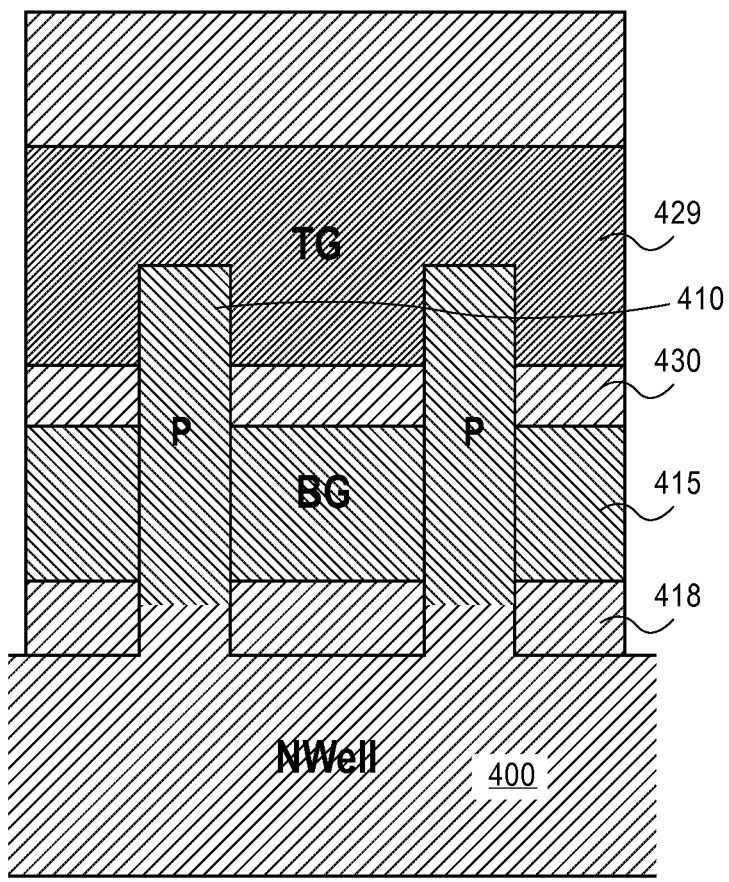
FIG. 20 is a cross-sectional, elevation view of two cells in the memory of FIG. 18, taken through section line 20-20 of FIG. 18.

Two completed cells, formed in an n well 400, viewed through the section lines 19-19 of FIG. 18, are illustrated in FIG. 19. Fins 410, doped with a p type dopant, and etched or grown from a bulk monocrystalline substrate are shown. The bottom gate 415, as mentioned, surrounds the fins and provides the bias for retaining the charge within the fins 415. The transistors for the FBCs are formed in the upper part of the fins 415 and include the doped n type source and drain regions 420, as will be described. FIG. 20 is an orthogonal view to that of FIG. 19, and again shows the fins 410. The bottom gate is insulated from the well 400 by the oxide 418, and from the top gate 429 by the oxide 430 as illustrated in both FIGS. 19 and 20.

Figure 21:
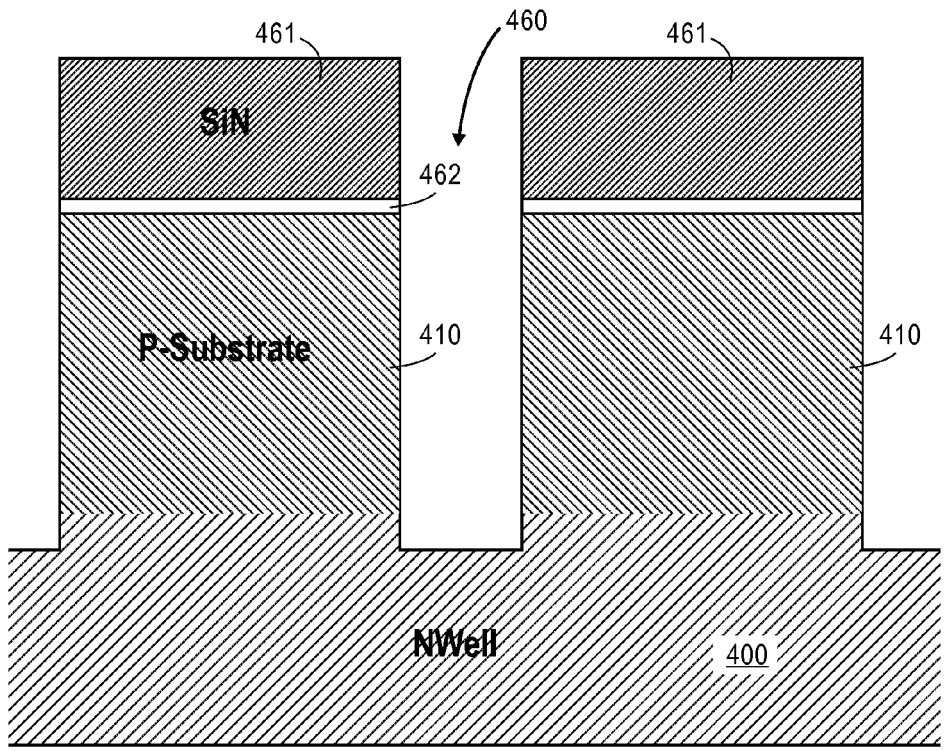
FIG. 21 is a cross-sectional, elevation view showing processing used to fabricate the FBCs of FIGS. 19 and 20, as seen through the section line 19-19.
Figure 22:
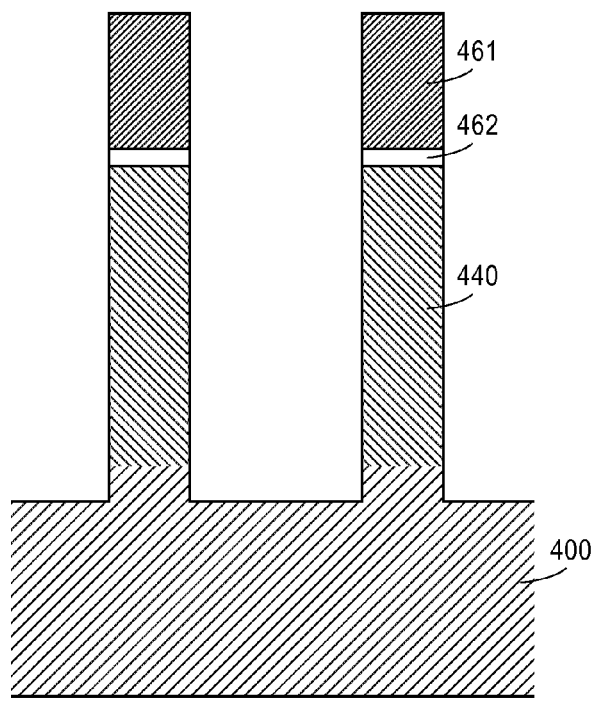
FIG. 22 is a cross-sectional, elevation view showing processing used to fabricate the FBCs of FIGS. 19 and 20, as seen through the section line 20-20 of FIG. 18.

Referring to FIGS. 21 and 22, the memory, as mentioned, for the illustrated embodiment, is realized on a bulk substrate, however, it may also be realized on an SOI substrate. An n well 400 is first implanted into a p type bulk wafer in the regions where the memory array is to be fabricated. Then, a thin layer of pad oxide 462 is deposited or grown across the wafer, followed by an isolation nitride deposition, as is typically used for a shallow trench isolation process. The trench isolations in the memory array section, can be first patterned by masking off the sections of the wafer used for logic devices. As an alternative, the isolation in the logic area can be processed at the same time as the memory section, followed by the removal of the bottom gate from the logic section while the bottom gate in the memory section is protected.

After removal of the trench isolation, there are a plurality of fins 410, as shown in FIGS. 21 and 22, formed in the n well 400, and capped with an oxide 462 and the silicon nitride hard masking members 461. Now, an insulator such as silicon dioxide or a polymer layer is deposited, planarized and etched back to leave a layer of insulation at the bottom of the isolation trenches, as shown as insulation 418 in FIG. 23. This insulation is used to avoid the turning on of parasitic transistors between neighboring devices, as shown by the line 465 in FIG. 23. (This problem was mentioned in the prior art section.) The insulation 418 may not be necessary depending upon the thickness of a bottom gate oxide and the doping level of the n well 400. The bottom gate oxide is formed in the bottom of the insulation trenches and on the sides of the fins 410.

Figure 23:
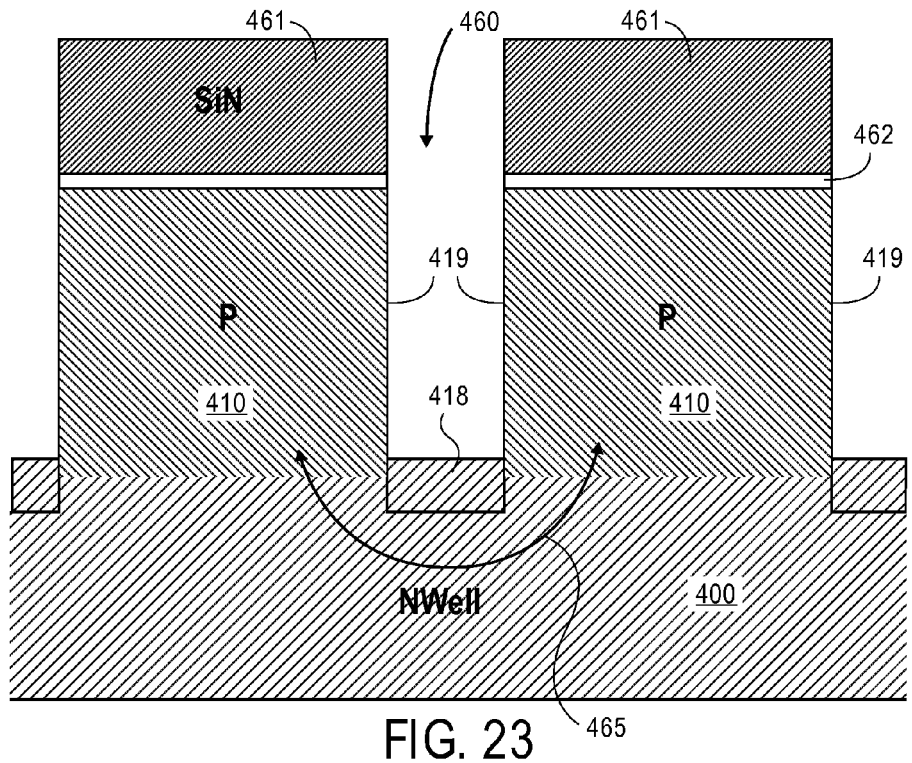
FIG. 23 illustrates the structure of FIG. 21, after the formation of oxide regions.
Figure 24:
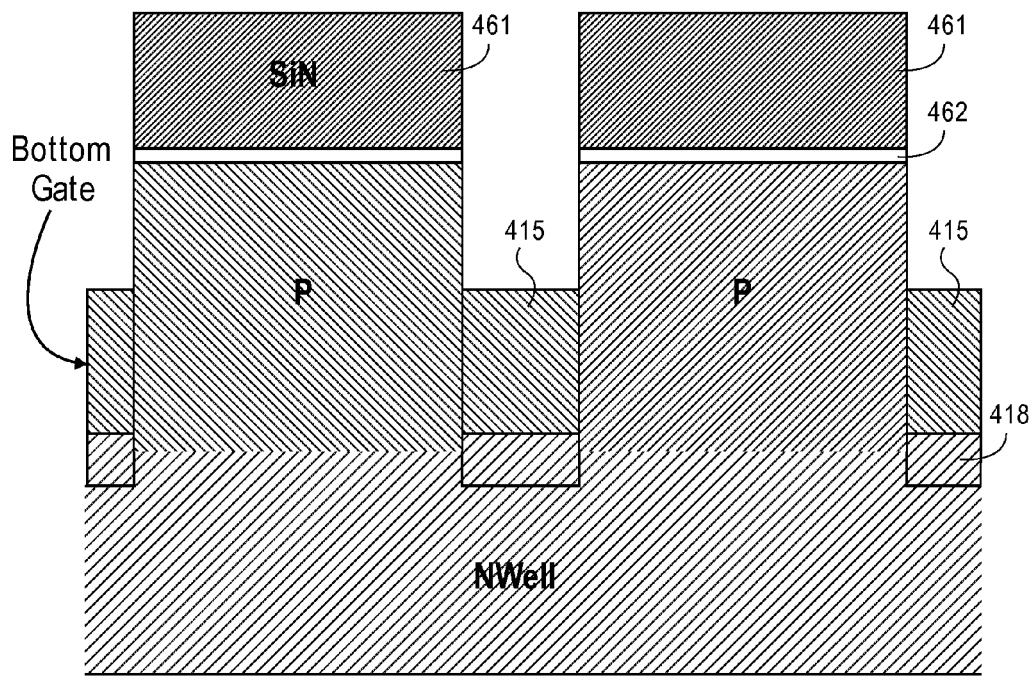
FIG. 24 illustrates the structure of FIG. 23, after the formation of the bottom gate, which corresponds to the back gate in a FBC.

Next, the gate oxide for the bottom gate is grown, for instance, in a dry atmosphere, on the surfaces 419 of FIG. 23. This oxide, for the reasons described in conjunction with FIGS. 5 and 6, is relatively thick to prevent the loss of charge between the bottom gate and the storage region of the fins 410. A polysilicon layer is now deposited to form the bottom gates 415. This is a blanket deposition of polysilicon which is planarized, and etched back to provide the polysilicon bottom gate 415 of FIG. 24. A vertical implantation step can be used to dope the polysilicon. While the polysilicon can be doped with an n type dopant (for an n channel FBC) for the reasons shown in FIG. 3, a p type dopant is preferred. Before and/or after the formation of the bottom gate, angled implants can be used to adjust the doping level in the p wells of the fins 410. Following this, the isolation trenches can be filled, planarized and etched back to provide the insulation 430 shown in FIGS. 19 and 20.

Known processing can next be used to fabricate tri-gate transistors or planar transistors in the upper regions of the fins 410. This can be done, as an example, using a replacement gate process where a tip implantation with an n type dopant is used followed by the formation of the spacers 425 of FIG. 19, prior to the doping of the main source and drain regions 420. The source and drain regions 420 are not deep enough to short to the n well 400. Some overlap between the source and drain region and the bottom gate is permissible, as the bottom gate is biased to accumulate charge in the floating body. By biasing the bottom gate so that charge accumulates, the gate cuts off the parasitic bi-polar transistor that would otherwise exist between the source and drain, p-body and n well. This improves the charge retention in a disturbed condition. While in the embodiment illustrated, the transistor is a tri-gate transistor, a planar transistor can be formed in the upper surface of the fins 410.

In either event, a more traditional silicon dioxide polysilicon gate may be used or a high-k insulator and metal gate favoring an n type work function may be used. Note that since the top gate is formed separately from the bottom gate, the gate dielectric thicknesses between the two can be different, allowing a thicker bottom gate insulator to improve retention time.

Thus, several embodiments of an FBC have been described where different gate insulation thickness and gate material within each cell is used.

What is claimed is:

1. A memory comprising:
    a semiconductor fin having a bottom region and an upper region and an uppermost surface;
    a first gate insulated from the semiconductor fin comprising a layer surrounding the bottom region of the semiconductor fin, wherein the layer comprises polysilicon, wherein the polysilicon comprises a p type dopant, the first gate having an uppermost surface below the uppermost surface of the semiconductor fin; and a transistor formed in the upper region of the semiconductor fin.

2. The memory defined by claim 1, wherein the transistor comprises a tri-gate transistor.

3. The memory defined by claim 2, wherein the tri-gate transistor has a high-k dielectric insulation and a metal gate with a work function of between approximately 4.6 to 5.2 eV.

4. The memory defined by claim 3, wherein the semiconductor fin is integral with a bulk silicon substrate.

5. The memory defined by claim 1, wherein the first gate is insulated by an oxide which is thicker than an oxide used for a gate insulator for the transistor.

6. A method comprising:
forming a plurality of spaced-apart, parallel semiconductor fins;
depositing a sacrificial layer between the spaced-apart fins;
forming a masking member between an upper surface of one fin and an upper surface of the next fin, alternately over the fins such that there are alternate covered and alternate uncovered regions between the fins; and
wet etching the sacrificial layer in the uncovered alternate regions between the fins.

7. The method defined by claim 6, wherein a first gate insulation is formed in the uncovered regions following removal of the sacrificial layer.

8. The method defined by claim 6, wherein a second gate insulation is formed after removal of the sacrificial layer from the covered regions in both the formerly covered and uncovered regions.

9. A method for fabricating a memory array comprising:
forming a plurality of parallel, spaced-apart fins, each of the plurality of fins having an uppermost surface;
forming a bottom gate substantially surrounding the lower portions of the fins, insulated from the fins, the bottom gate having an uppermost surface below the uppermost surface of each of the plurality of fins;
forming a transistor in the upper part of the fins, wherein the bottom gate is a p type polysilicon gate and the transistor is an n channel transistor.

10. The method defined by claim 9, wherein the transistor is a tri-gate transistor.

11. The method defined by claim 9, wherein the transistor is a planar transistor.

12. The method defined by claim 9, wherein the bottom gate is insulated from the fin by a gate dielectric which is thicker than the gate dielectric used in the transistor.

13. A memory comprising:
a semiconductor fin having a bottom region and an upper region and an uppermost surface;
a first gate insulated from the semiconductor fin comprising a layer surrounding the bottom region of the semiconductor fin, the first gate having an uppermost surface below the uppermost surface of the semiconductor fin; and
a transistor formed in the upper region of the semiconductor fin, wherein the transistor comprises a tri-gate transistor, and wherein the tri-gate transistor has a high-k dielectric insulation and a metal gate with a work function of between approximately 4.6 to 5.2 eV.

14. The memory defined by claim 13, wherein the semiconductor fin is integral with a bulk silicon substrate.

15. The memory defined by claim 13, wherein the first gate is insulated by an oxide which is thicker than an oxide used for a gate insulator for the transistor.

16. A memory comprising:
a semiconductor fin having a bottom region and an upper region and an uppermost surface;
a first gate insulated from the semiconductor fin comprising a layer surrounding the bottom region of the semiconductor fin, the first gate having an uppermost surface below the uppermost surface of the semiconductor fin; and
a transistor formed in the upper region of the semiconductor fin, wherein the first gate is insulated by an oxide which is thicker than an oxide used for a gate insulator for the transistor.

17. A method for fabricating a memory array comprising:
forming a plurality of parallel, spaced-apart fins, each of the plurality of fins having an uppermost surface;
forming a bottom gate substantially surrounding the lower portions of the fins, insulated from the fins, the bottom gate having an uppermost surface below the uppermost surface of each of the plurality of fins;
forming a transistor in the upper part of the fins, wherein the transistor is a planar transistor.

* * * * *